(12) United States Patent
Kim et al.

(10) Patent No.: US 7,298,032 B2
(45) Date of Patent: Nov. 20, 2007

(54) SEMICONDUCTOR MULTI-CHIP PACKAGE AND FABRICATION METHOD

(75) Inventors: Dong-Kuk Kim, Gyeonggi-Do (KR); Chang-Cheol Lee, Cheonan (KR)

(73) Assignee: Samsung Electronics Co., Ltd., Suwon-si, Gyeongi-do (KR)

( * ) Notice: Subject to any disclaimer, the term of this patent is extended or adjusted under 35 U.S.C. 154(b) by 46 days.

(21) Appl. No.: 10/787,679

(22) Filed: Feb. 25, 2004

(65) Prior Publication Data

US 2004/0201088 A1    Oct. 14, 2004

(30) Foreign Application Priority Data

Apr. 8, 2003    (KR) .................. 10-2003-0021922

(51) Int. Cl.
*H01L 23/02*    (2006.01)
(52) U.S. Cl. ................ 257/686; 257/777; 257/E23.085
(58) Field of Classification Search ................ 257/686, 257/777, 723, E23.085
See application file for complete search history.

(56) References Cited

U.S. PATENT DOCUMENTS

| | | | | |
|---|---|---|---|---|
| 5,847,445 | A * | 12/1998 | Wark et al. .................. | 257/669 |
| 6,348,363 | B1 | 2/2002 | Chung et al. | |
| 6,400,007 | B1 * | 6/2002 | Wu et al. .................... | 257/686 |
| 6,531,784 | B1 * | 3/2003 | Shim et al. ................. | 257/777 |
| 6,683,385 | B2 * | 1/2004 | Tsai et al. .................... | 257/777 |
| 6,930,396 | B2 * | 8/2005 | Kurita et al. ................ | 257/777 |
| 2002/0096755 | A1 * | 7/2002 | Fukui et al. ................. | 257/686 |
| 2002/0125556 | A1 * | 9/2002 | Oh et al. ..................... | 257/685 |
| 2003/0038355 | A1 | 2/2003 | Derderian | |
| 2003/0038357 | A1 * | 2/2003 | Derderian ................... | 257/686 |

FOREIGN PATENT DOCUMENTS

| | | |
|---|---|---|
| DE | 197 47 105 A1 | 10/1997 |
| KR | 1997-0013138 | 3/1997 |
| KR | 2002-0077650 | 10/2002 |

OTHER PUBLICATIONS

English language abstract of Korean Publication No. 1997-0013138.
English language abstract of Korean Publication No. 2002-0077650.

* cited by examiner

*Primary Examiner*—Phat X. Cao
(74) *Attorney, Agent, or Firm*—Marger Johnson & McCollom, P.C.

(57) ABSTRACT

A multi-chip package comprises a package substrate having bond fingers disposed thereon. A first chip have center bonding pads formed on a substantially center portion thereof. The first chip is disposed on the package substrate. Insulating support structures are formed on the first chip located outward of the bonding pads. A bonding wire is connected between one of the bond fingers and at least one of the center bonding pads. A second chip has is disposed over the bonding wire and overlying the insulating support structures.

3 Claims, 9 Drawing Sheets

SEMICONDUCTOR MULTI-CHIP PACKAGE AND FABRICATION METHOD

CROSS REFERENCE TO RELATED APPLICATIONS

This U.S. non-provisional application claims priority under 35 U.S.C. §119 from Korean Patent Application No. 2003-21922, filed on Apr. 8, 2003, the contents of which are incorporated herein by reference in their entirety.

BACKGROUND OF THE INVENTION

1. Field of the Invention

The present invention relates to semiconductor devices and, more particularly, to a semiconductor multi-chip package and a method of manufacturing the same.

2. Description of Related Art

Conventional semiconductor chips have either a center pad configuration, wherein bonding pads 12 are formed on a center region of the chips, or a peripheral pad configuration, wherein bonding pads 14 are formed on a peripheral region of the chips. FIG. 1A is a plan view of a semiconductor chip having a center pad configuration and FIG. 1B is a plan view of a semiconductor chip having a peripheral pad configuration. The center pad configuration is generally more suitable for achieving high-speed operation of semiconductor devices.

Currently, the semiconductor industry is expending significant resources toward forming semiconductor multi-chip packages that can meet the demand for high packing density in high-speed, multi-functional semiconductor devices. As part of such efforts, the industry has proposed semiconductor multi-chip packages that include stacked chips having a peripheral pad configuration.

One such conventional multi-chip package is shown in FIG. 2. Referring to FIG. 2, a semiconductor multi-chip package includes stacked chips 20, 40, each having a peripheral pad configuration. The chips 20, 40 are stacked one on top of the other with a spacer 30 placed between them. Unfortunately, however, the multi-chip package of FIG. 2 cannot be assembled using a lower chip with a center pad configuration, because the center pads do not provide sufficient room between them for placement of a spacer.

FIG. 3 illustrates one conventional attempt to provide a semiconductor multi-chip package 32 having a lower chip 32 originally configured having a center pad configuration, i.e., pad wiring patterns (not shown) formed on a center region thereof ("center pad wiring patterns").

FIGS. 4 and 5 illustrate a technique for redistributing center pad wiring patterns 36 to peripheral bonding pads 38, in which an actual wire bonding process is performed. Referring to FIGS. 3-5, a conventional multi-chip package 32, according to this example, includes stacked chips 32, 34 originally configured having a center pad configuration. The center pad wiring patterns 36 of the semiconductor chips 32, 34 are redistributed from a center region to a peripheral region using redistribution patterns 39.

In other words, the center pad wiring patterns 36 are connected to the peripheral bonding pads 38 through the redistribution patterns 39. This allows for a spacer 37 to be placed between the bonding pads 38 on the lower chip 32 to form a multi-chip package 300 comprising stacked chips 32, 34 with the center pad wiring patterns 36.

Unfortunately, however, the cost of redistributing the pad wiring patterns is considerably high, and the process and package reliability are yet to reach desirable levels. Accordingly, a need remains for a reliable and cost-effective method of manufacturing semiconductor multi-chip packages using chips having a center pad configuration.

SUMMARY OF THE INVENTION

According to principles of the present invention, a high-density semiconductor multi-chip package can be formed using chips with a center pad configuration. This can preferably be accomplished using existing assembly equipment and without the use of costly and unreliable pad redistribution processes.

According to one embodiment, for example, a multi-chip package comprises a package substrate having bond fingers disposed thereon. A first chip is disposed on the package substrate and preferably includes first bonding pads formed on a substantially center portion of the chip. Insulating support structures are preferably formed outward of the bonding pads on the first chip. A bonding wire is preferably connected between one of the bond fingers and at least one of the first bonding pads. A portion of the bonding wire is preferably spaced apart from the first chip using the support structures. A second chip is disposed over the bonding wire and overlying the insulating support structures.

BRIEF DESCRIPTION OF THE DRAWINGS

The objects, features, and advantages of the present invention will be more readily apparent through the following detailed description of preferred embodiments made in conjunction with the accompanying drawings. In the drawings, like reference numerals denote the same or similar members and the thicknesses of layers or regions may be exaggerated for clarity, in which.

DETAILED DESCRIPTION OF PREFERRED EMBODIMENTS

Various embodiments of the present invention will now be described in detail with reference to the attached drawings. It should be noted, however, that the various embodiments of the present invention described herein can be modified in arrangement and detail, and that the scope of the present invention is not restricted to the described embodiments. Rather, these exemplary embodiments are provided to demonstrate the principles of the present invention to those skilled in the art.

Figure 12:
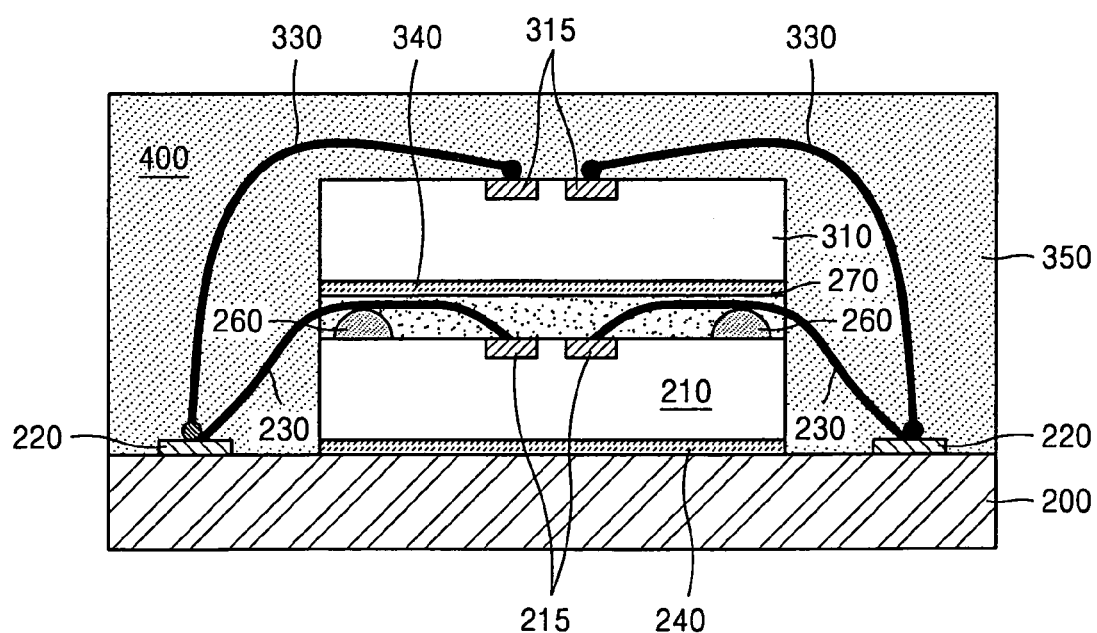

FIG. 12 illustrates a preferred embodiment of a multi-chip package constructed according to principles of the present invention. Referring to FIG. 12, a multi-chip package 400 preferably comprises a package substrate 200 having bond fingers 220 disposed thereon. A first chip 210 preferably has a center pad configuration, and therefore includes first bonding pads 215, formed on a substantially center portion thereof. The first chip 210 is preferably disposed on the package substrate 200.

Insulating support structures 260 are preferably formed on the first chip 210 outwards of the bonding pads 215. The insulating support structures 260 can, for example, be formed spaced apart from each other along opposite sides of the first chip 210, with the bonding pads 215 therebetween. The insulating support structures 260 can, for example, extend in a line shape along a periphery of at least two opposing sides of the first chip 210 (see FIG. 9).

Figure 9:
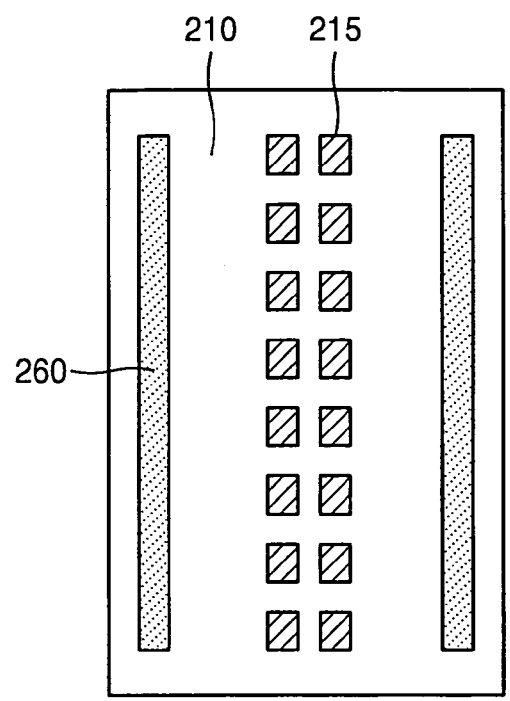
Figure 14A:
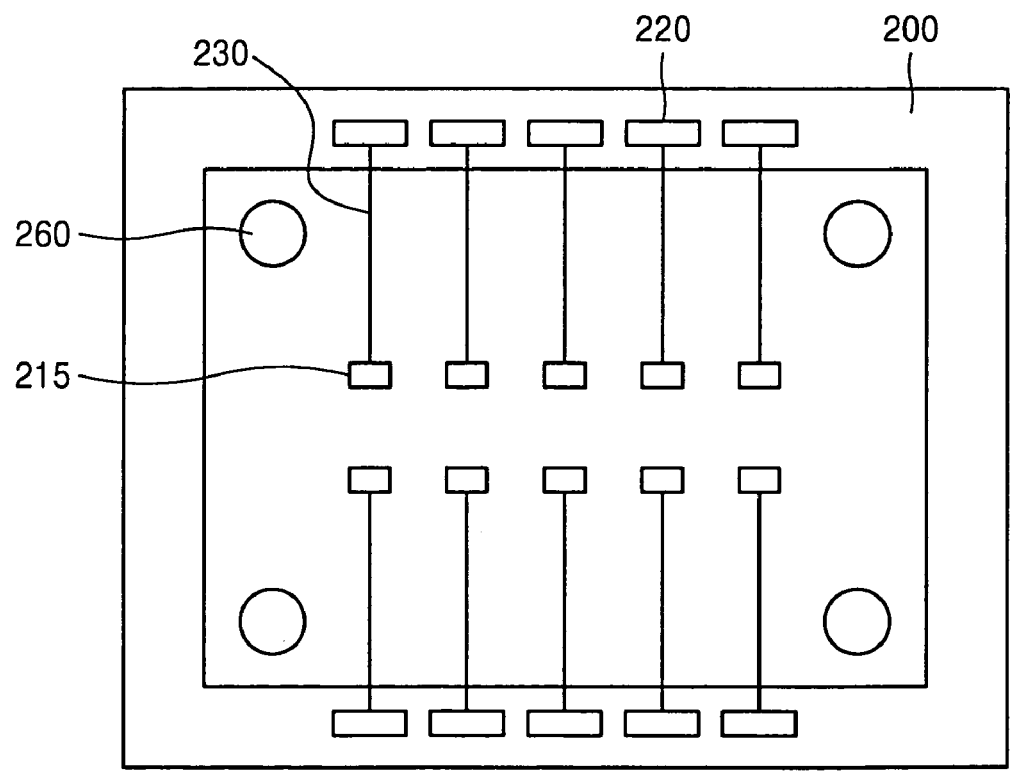
FIG. 14A is a plan view illustrating a semiconductor chip with insulating support structures disposed thereon according to one aspect of the present invention.
Figure 14B:
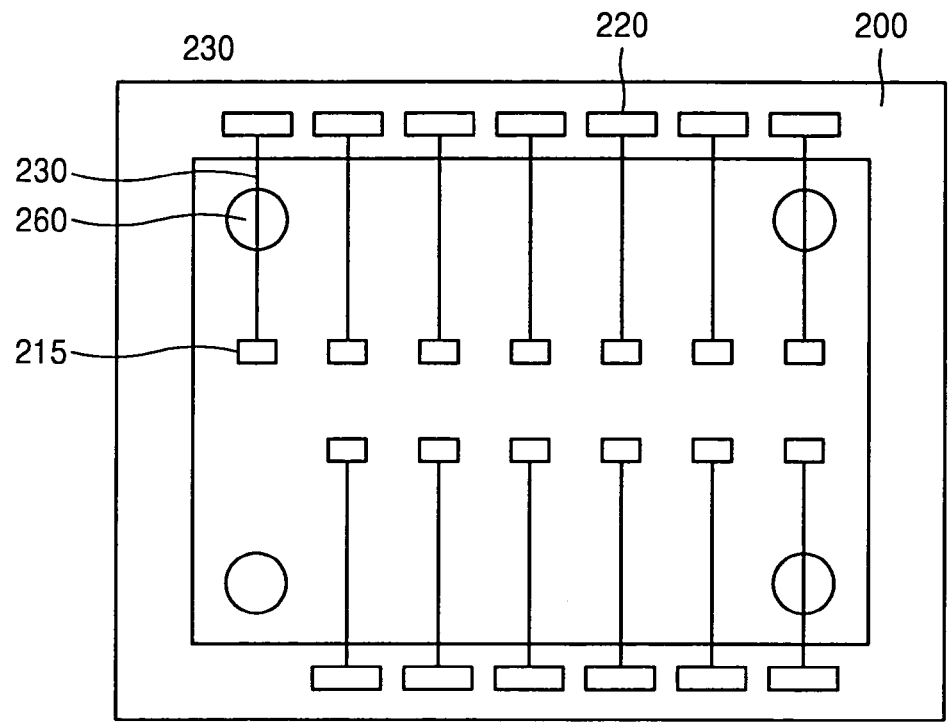
FIG. 14B is a plan view illustrating a semiconductor chip with insulating support structures disposed thereon according to another aspect of the present invention.

The support structures 260 are by no means limited, however, to having a line shape, and other shapes are within the contemplation of the invention. For example, the support structures 260 may be a plurality of separate, mound-like structures disposed along the length of two or more edges of the first chip 210. The support structures 260 can also be formed in corners of the first chip 210 as shown in FIGS. 14A-14B. By using separate, mound-like support structures, manufacturing costs and processing time can be reduced, as compared to the line-shaped support structures 260, because the amount of material required to form the insulating support structures can be reduced. Also, the support structures 260 are not limited to a straight line shape as shown in FIG. 9. Other shapes such as a wavy line shape may be used to implement the present invention. In addition, more than a single line of insulating support structures 260 can be formed on opposing peripheral regions of the first chip 210 depending on manufacturing objectives.

A bonding wire 230 is preferably connected between one of the bond fingers 220 and at least one of the first bonding pads 215. The bonding wire 230 is preferably spaced apart from the first chip 210 by the insulating support structures 260. It is also desirable to ensure that the top of the bonding wire loop 230 is not substantially higher than the top of the support structures 260. A second chip 310 having second bonding pads 315 is preferably disposed over the bonding wire 230 and overlying the insulating support structures 260.

Figure 13:
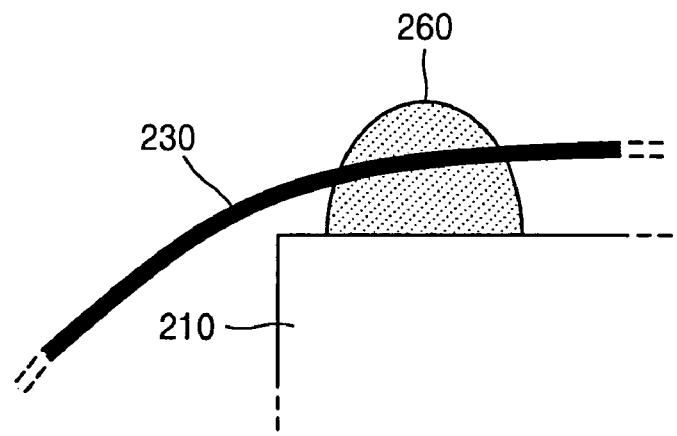
FIG. 13 is a cross-sectional view of an insulating support structure according to another embodiment of the present invention.

FIG. 13 illustrates an alternative embodiment incorporating principles of the present invention. Referring to FIG. 13, the bonding wire 230 may pass through, rather than overlying, the support structures 260. In this configuration, the insulating support structures 260 can directly support the second chip 310.

In still other embodiments, however, depending on manufacturing objectives, the bonding wire 230 need not directly contact the support structures 260 and could, for example, be arranged over but not touching or alongside the line-shaped or separate, mound-like support structures 260.

Figure 10:
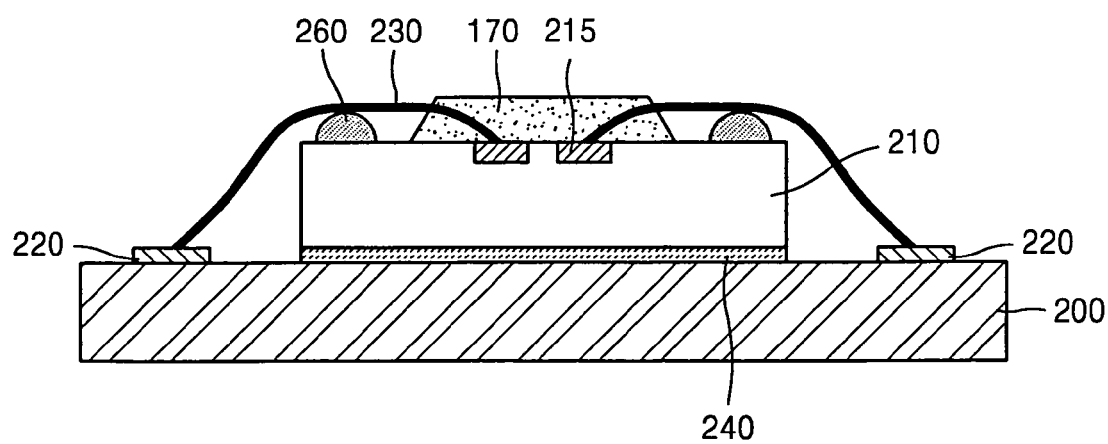
Figure 11:
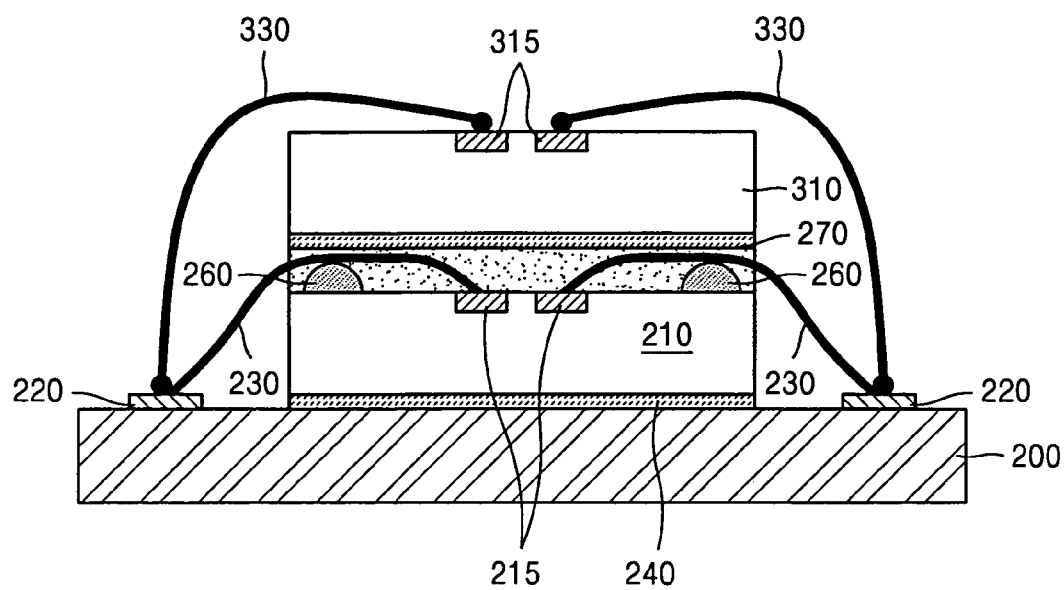

FIG. 11 illustrates another aspect of the present invention. Referring to FIG. 11, the multi-chip package 400 preferably includes an interposer 270 sandwiched between the first chip 210 and the second chip 310 for adhesion therebetween. The interposer 270 supports the second chip 310 and prevents it from touching the bonding wire 230 connected to the first chip 210. An interposer material 170—for example, an epoxy without a filler such as silica therein—is preferably placed between the spaced apart support structures 260 (see FIG. 10) to form the interposer 270. Various alternative embodiments can be formed, however, without using the interposer 270, by instead using the insulating support structures 260 and/or insulating tape 340 to support the second chip 310 and insulate the bonding wires 230.

Referring again to FIG. 12, the multi-chip package 400 may further include an insulating tape 340 disposed between the second chip 310 and the bonding wire 230, for example, to provide isolation therebetween. The insulating tape 340 is preferably formed on a bottom surface of the second chip 310. The insulating tape 340 may directly touch the bonding wire 230, although not shown. Also, the insulating tape 340 may directly touch the insulating support structures 260, for example, if the bonding wire 230 passes through the support structures 260 as described in connection with FIG. 13 or FIG. 14B. Alternatively, the insulating tape 340 may contact the interposer 270 without contacting the bonding wire 230 or the insulating support structures 260.

The multi-chip package 400 may also include an epoxy molding compound (EMC) 350 that encapsulates the first and second chips 210, 310. Although not shown, if the interposer 270 is not formed on the first chip 210, the EMC 350 is preferably instead disposed between the first chip 210 and the second chip 310 in place of the interposer 270.

Manufacturing Method

Figure 1A:
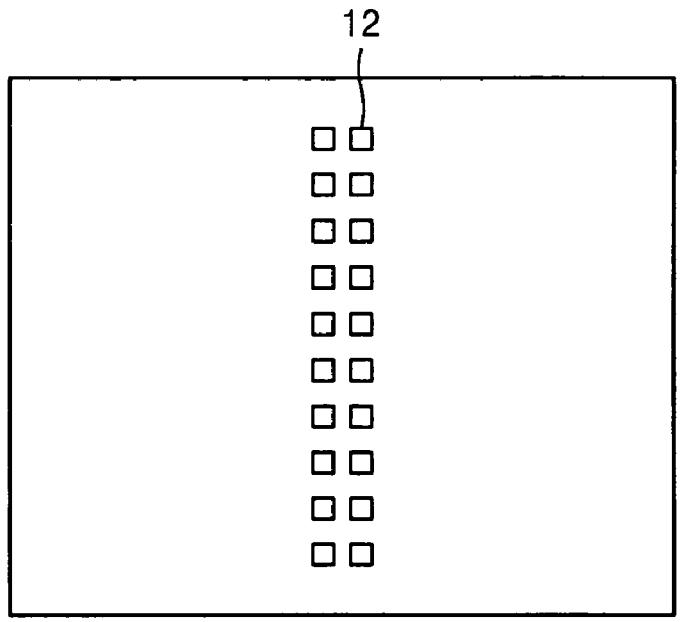
FIG. 1A is a plan view illustrating a semiconductor chip having a center pad configuration according to the related art.
Figure 1B:
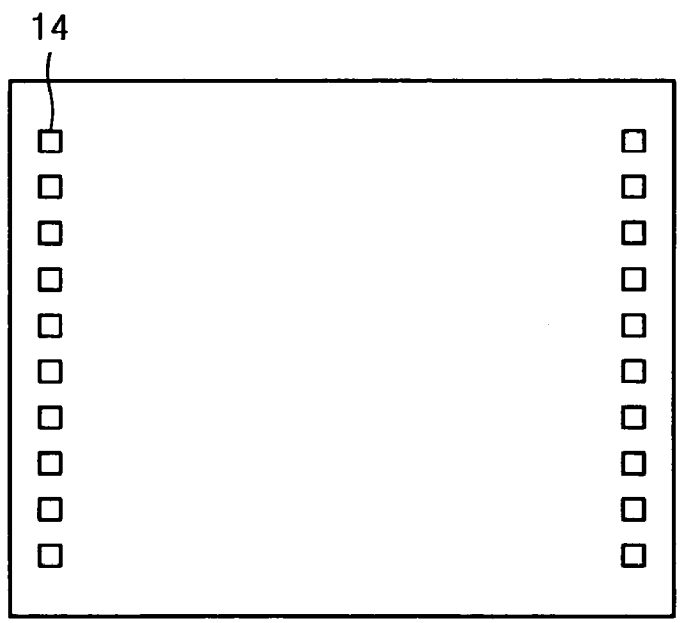
FIG. 1B is a plan view illustrating a semiconductor chip having a peripheral pad configuration according to the related art.
Figure 2:
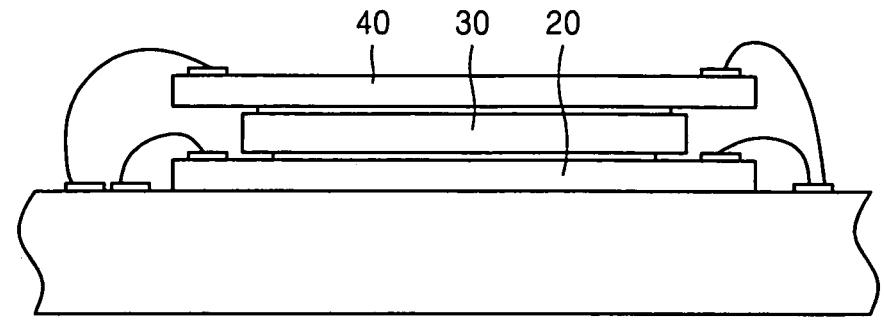
FIG. 2 is a cross-sectional view of a conventional multi-chip package having chips with peripheral bonding pads.
Figure 3:
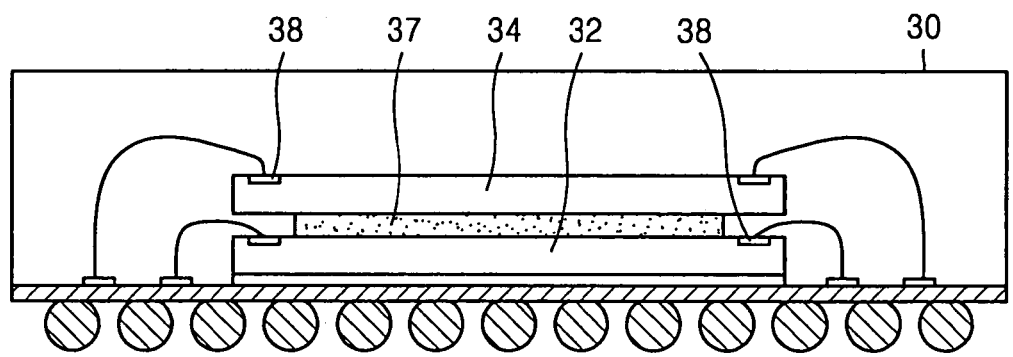
FIG. 3 is a cross-sectional view of a multi-chip package with a chip having a center bonding pad redistributed to a peripheral bonding pad according to the related art.
Figure 4:
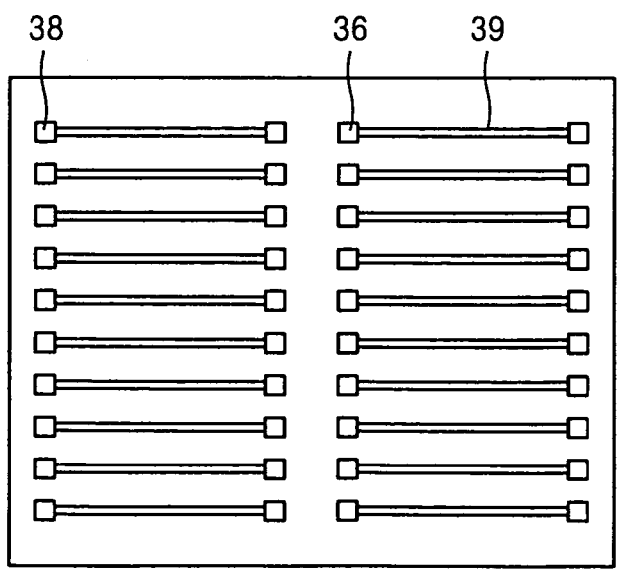
FIG. 4 is a plan view of a conventional semiconductor chip having bonding pads redistributed from a center region to a peripheral region.
Figure 5:
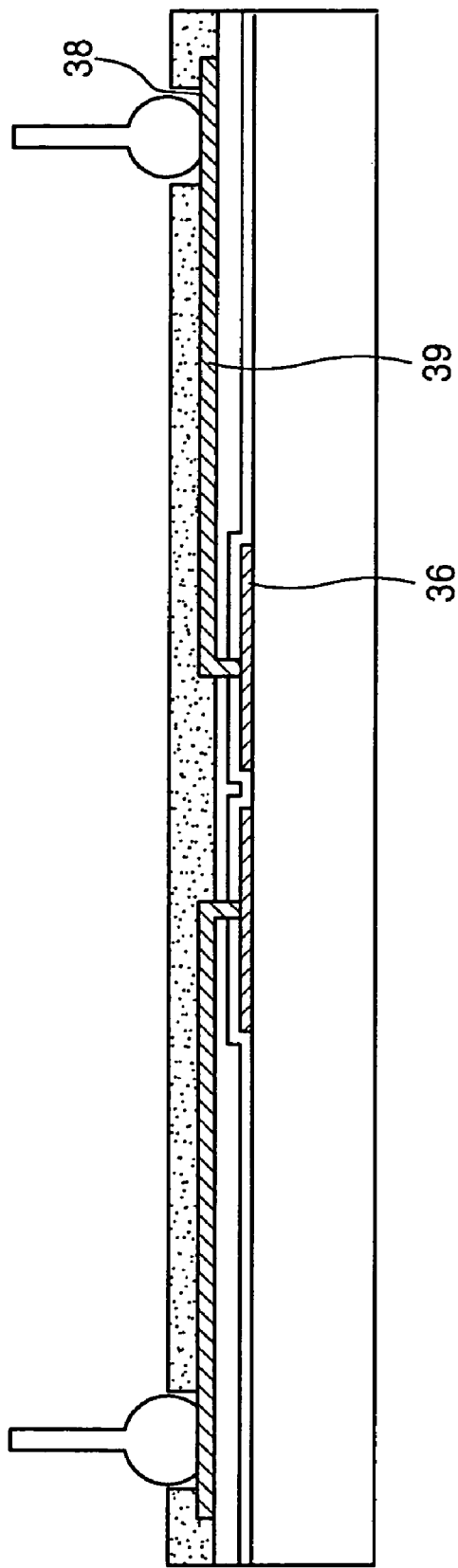
FIG. 5 is a cross-sectional view of a conventional semiconductor chip with bonding pads redistributed from a center region to a peripheral region.
Figure 6:
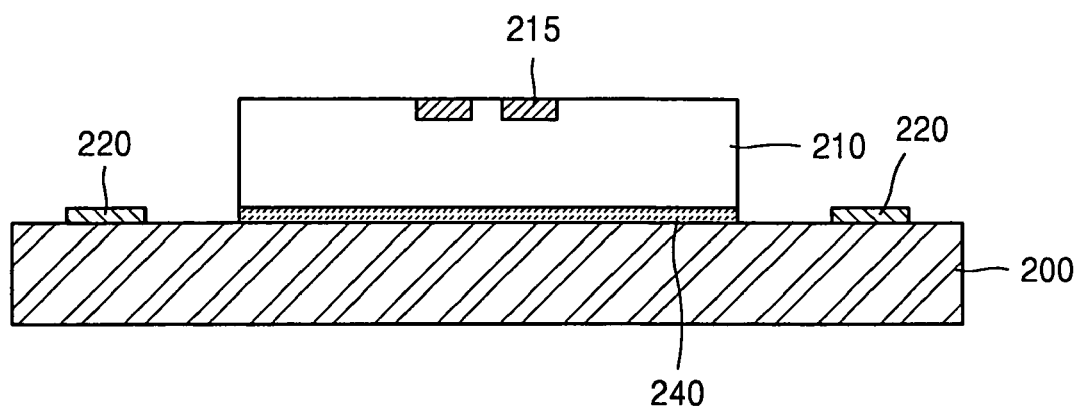
FIGS. 6 to 12 are cross-sectional views illustrating a process of manufacturing a semiconductor multi-chip package according to an embodiment of the present invention.

A preferred method of manufacturing the above-described semiconductor multi-chip package 400 will now be described in greater detail with reference to FIGS. 6-12. Referring specifically to FIG. 6, a semiconductor multi-chip package 400 is formed by mounting a lower (or first) semiconductor chip 210 on a package substrate 200. This can be accomplished using conventional techniques. An adhesive 240 can, for example, be applied on the package substrate 200 using a conventional die-bonder having a dispenser unit for dispensing the adhesive 240. The adhesive may be a conventional adhesive material typically used in semiconductor packaging.

The package substrate 200 may be a printed circuit board (PCB) or other package substrate such as a lead frame or a wiring tape, for example. The substrate 200 preferably has bond fingers (or wire connection contacts) 220 for electrical connection between the package substrate 200 and the first chip 210. The first chip 210 preferably has first bonding pads (center bonding pads) 215 formed on a substantially center portion of the chip 210. The lower semiconductor chip 210 is preferably attached to the package substrate 200 using the adhesive 240.

Figure 7:
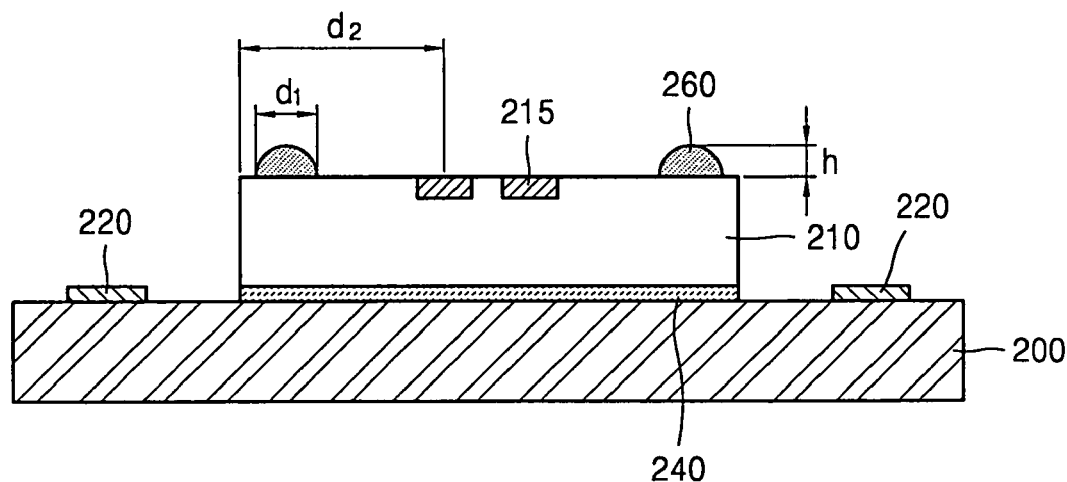

Referring now to FIG. 7, insulating support structures 260 can be formed by applying a liquid type nonconductive epoxy resin, or any other suitable non-conductive insulating material, for example, hybrid type adhesive, silicon type adhesive, film type adhesive, on the peripheral surface (i.e., the surface of the peripheral region) of the lower chip 210. This can be done using conventional techniques, including, for example, a dispensing technique. A die bonder dispenser unit, as used to apply the adhesive 240 onto the package substrate 200, can be used to provide the epoxy resin onto the peripheral surface of the lower chip 210. The insulating support structures 260 can, for example, be arranged as lines along the peripheral region of the lower chip 210 (see FIG. 9) or they can be arranged as a plurality of separate, mound-like structures aligned, for instance, with the center bonding pads 215.

The resultant structure is then preferably heat treated at approximately 100° C. or higher to solidify the epoxy resin of the support structures 260, as well as the adhesive 240. The insulating support structures 260 can thereby be formed on the peripheral region of the lower chip 210. The width d1 of the support structures 260 is preferably less than half of the distance d2 between the center of the bonding pads 215 and the nearest edge of the first chip 210. In addition, the height h of the support structures 260 is preferably between about 25~200 μm.

Figure 8:
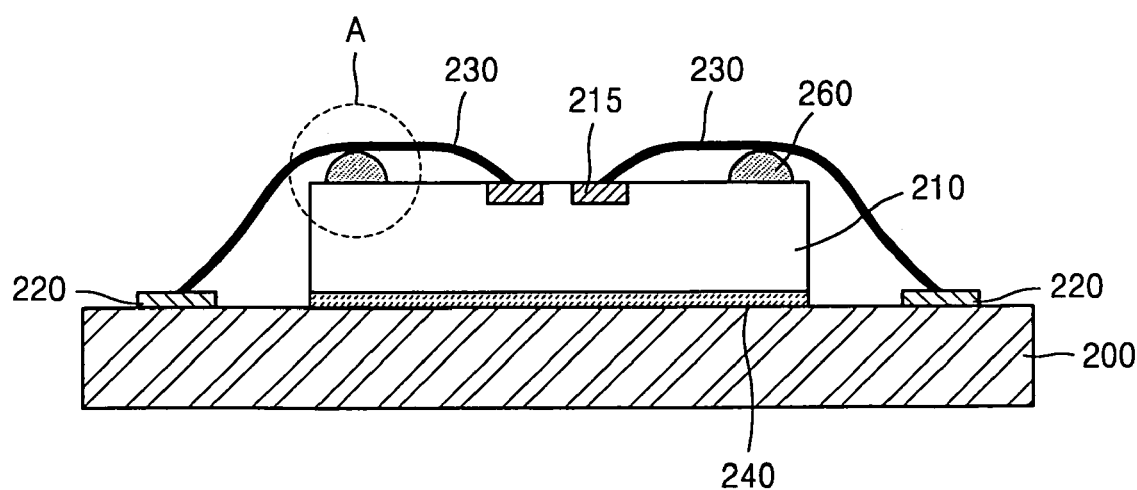

Referring to FIG. 8, a portion of the bond fingers 220 are preferably electrically connected to the first bonding pads 215 through first bonding wires 230 made of a conductive material such as gold or copper. This wire bonding process can be performed using conventional techniques including, but not limited to, a wedge bonding technique or a bump reverse ball bonding technique. The wire bonding process may be performed directly on the first bonding pads 215 formed on a substantially center portion of the chip 210. The first wires 230 may directly contact the top surface of (i.e., placed directly overlying) the support structures 260, as shown in reference area A. The bonding wires 230 could also be configured to pass through the support structures 260 (see FIG. 13) or located over the insulating support structures 260 such that they do not touch the support structures 260. Using the insulating support structures 260, conventional problems such as bond wire sagging can be reduced.

Referring to FIG. 10, an interposer material 170 is preferably provided on the surface of the lower chip 210. The interposer material 170 may be a liquid, and may be the same as the material used to form the support structures 260. The interposer material 170 can be applied using a conventional dispensing technique.

Referring to FIG. 11, an upper (or second) semiconductor chip 310 is mounted on the first chip 210. The second chip 310 may have either a center pad configuration or a peripheral pad configuration. The loop height and the shape of the wires 230 are preferably controlled such that the first wires 230 do not contact the bottom surface of the second chip 310. In this respect, the bonding wires 230 may have a low loop height and have a substantially flat portion suitable for stacking the second chip 310 over the first chip 210. The package thickness can thereby be reduced and device failure resulting from unwanted contact between the wires 230 and the second chip 310 can be prevented.

Optionally, the second chip 310 may have an insulating tape 340 disposed on the bottom side thereof. The insulating tape 340 prevents the bottom surface of the second chip 310 from touching the first wires 230 and allows the second chip 310 to be arranged closer to the first chip 210, reducing overall package thickness.

The insulating tape 340 is not required, however, and even without the insulating tape 340, sufficient isolation between the wires 230 and the second chip 310 can be obtained through use of the interposer 270 and/or the insulating structures 260 disposed between the first and second chips 210, 310. For example, if the bonding wire 230 passes through the support structures 260 as described in connection with FIG. 13 or FIG. 14B, the insulating tape 340 is not needed between the first chip 210 and the second chip 310. In either of these embodiments, the bonding wires 230 are preferably distanced sufficiently from the bottom surface of the second chip 310 to provide isolation therebetween. Thus, according to various embodiments of the present invention, the height of the first bonding wires 230 (the wire loop) can be substantially reduced, which in turn substantially reduces the overall package thickness.

During mounting or attaching of the second chip 310 to the first chip 210, the interposer material 170 is pushed down and spreads out toward the peripheral region of the lower chip 210. During this process, the insulating support structures 260 extending along the length of the first chip 210 (see FIG. 9) act as a dam structure, helping to contain the interposer material 170 within the boundaries of the first chip 210 and prevent it from leaking out onto the package substrate 200. Although it is possible to have insulating support structures 260 arranged on more than two sides of the first chip 210, because voids may be generated within the interposer material 170 when mounting or attaching the upper chip 310 on the lower chip 210, it is preferable to have the insulating support structures 260 extend along only two opposing sides of the first chip 210.

By helping to prevent the interposer material 170 from flowing onto the sidewalls of the lower chip 210, an adequate thickness of the interposer 270 can be maintained. In addition, by preventing the interposer material 170 from flowing between the lower chip 210 and the housing 350, weak adhesion between them can be prevented. For example, if the interposer material 170 is permitted to escape from the edge of the lower chip 210, the interposer material 170 having the weak adhesion characteristics are interposed between the lower chip 210 and the an epoxy molding compound that encapsulates the first and second chips 210, 310, thereby preventing the strong direct adhesion between the molding compound that forms a housing 350 (FIG. 12) and the lower chip 210. Escape of the interposer material 170 can thereby lower the overall package reliability. The support structures 260 may also be useful in maintaining a parallel relationship between the second chip 310 and the first chip 210 during the attachment. This also improves the yield and reduces the overall package thickness.

After the second chip 310 is mounted on the first chip 210, the interposer material 170 is then solidified by thermal treatment at a temperature between about 50° C. to about 200° C. to form an interposer 270. The interposer 270 permits the lower and upper chips 210, 310 to be adjoined to each other while further securing the bonding wires 230 within the solidified interposer 270. Because the interposer 270 can prevent the first wires 230 from being swept or bent by a flowing molding compound during a transfer molding process, conventional encapsulation problems such as wire sweeping and sagging caused by an encapsulation material can be effectively prevented. In addition, the interposer 270 also provides isolation between the first chip 210 and the second chip 310.

The other portions of the bond fingers 220 are preferably electrically connected to second bonding pads 315 formed in the upper chip 310 through second bonding wires 330. This can also be done using conventional wire bonding techniques, as discussed above. The upper chip 310 may also have insulating support structures formed using similar methods to those described above.

Referring to FIG. 12, the resultant structure can then be subjected to a molding process to form a housing 350. This can be a conventional molding process using EMC. Those skilled in the art, however, will appreciate that the housing 350 can be formed of materials other than EMC, such as ceramic, and that it can be formed using processes other than the conventional molding process. As pointed out previously, the interposer 270 prevents the first wires 230 from being swept and bent by a molding compound during a transfer molding process. Thus, bonding wire reliability and package reliability can be substantially improved compared to conventional packages having such wire sweeping and sagging problems. A conductive ball array such as a solder ball array can be formed on the bottom side of the package substrate 200 to form a ball grid array (BGA) package and to permit interconnection to an external system.

Alternative Embodiments

FIG. 13 illustrates an alternative embodiment implementing the principles of the present invention. Referring to FIG. 13, this alternative embodiment is similar to the embodiment illustrated in FIGS. 6-13B, except that the support structures 260 are formed after forming the first wires 230. Accordingly, in this embodiment, the first wires 230 can pass through the support structures 260. In the specific embodiment shown, the first wires 230 pass through a middle portion of the support structures 260 such that the first wires 230 are fixed or secured within the support structures 260. One advantage of this embodiment is that the top height of the first wires 230 is lower than the top height of the support structures 260. The bottom side of the upper chip 310 can thereby be sufficiently isolated from the first wires 230 and the wire sweeping and sagging problem can be prevented and insulating tape 340 is not needed. The upper chip 310 can also be kept parallel with the lower chip 210.

According to yet another embodiment of the present invention, a single-chip package can benefit from various principles of this invention. In this embodiment, after forming the support structures 260, the resultant structure may be subjected to a molding process and a process for forming a solder ball array. In this single-chip embodiment, the support structures 260 help prevent sweeping and sagging of the first wires 230 during the molding process.

Wafer-Level Manufacturing Technique

Figure 15:
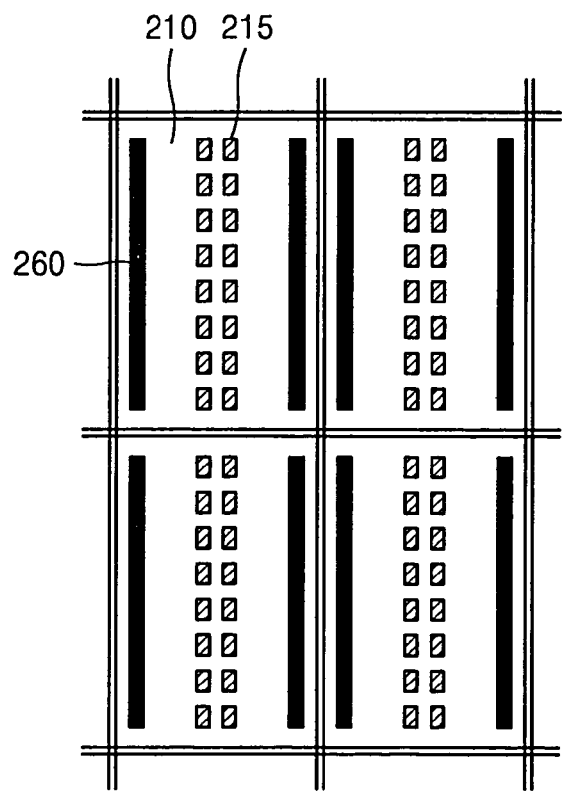
FIG. 15 is a plan view of a wafer level package according to yet another embodiment of the present invention.
Figure 16:
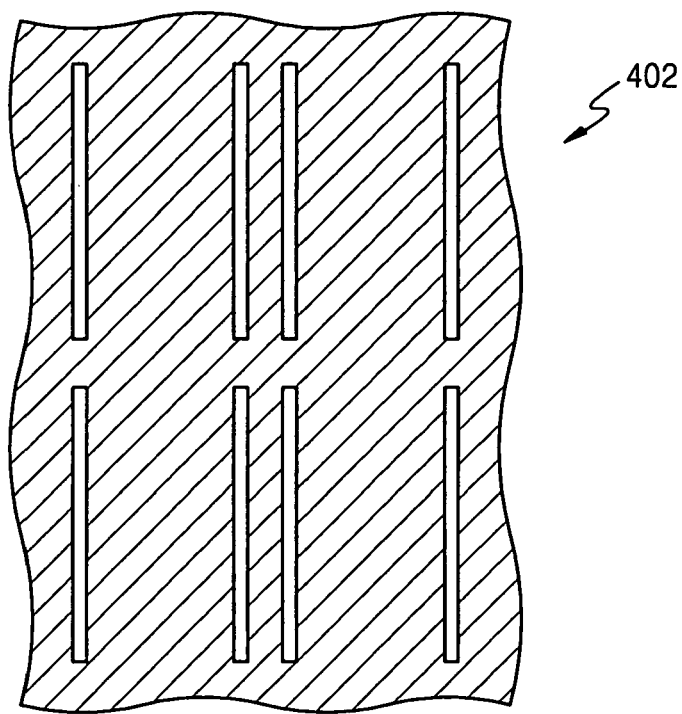
FIG. 16 is a plan view of a screen mask for use in forming a wafer level package having the structure shown in FIG. 15.

FIGS. 15 and 16 illustrate a wafer-level manufacturing technique according to still another aspect of the present invention. The wafer-level manufacturing process is similar to the process explained above with reference to FIGS. 6 through 13B, except that the support structures 260 can be formed at the wafer level.

Referring to FIG. 15, a wafer includes a plurality of chips 210, each having insulating support structures 260 formed thereon. The support structures 260 can be formed using a wafer-level dispensing technique similar to the dispensing techniques described previously. The support structures 260 may also be formed using a screen-printing technique. FIG. 16 shows a screen mask 402 used to form line-shaped support structures 260. The screen mask 402 could also be used to form a plurality of separate, interspersed structures. The screen-printing technique provides better control over the width and height of the support structures 260. After the insulating support structures 260 are formed, the wafer are cut out (dicing) to singulate the plurality of chips 210. Next, the processes described above or similar methods are performed to form a multi-chip package according to the principles of the present invention. The method of forming support structures 260 at the wafer level may also be used for a package having only a single chip.

Chip Packages Having Three or More Chips

Figure 17:
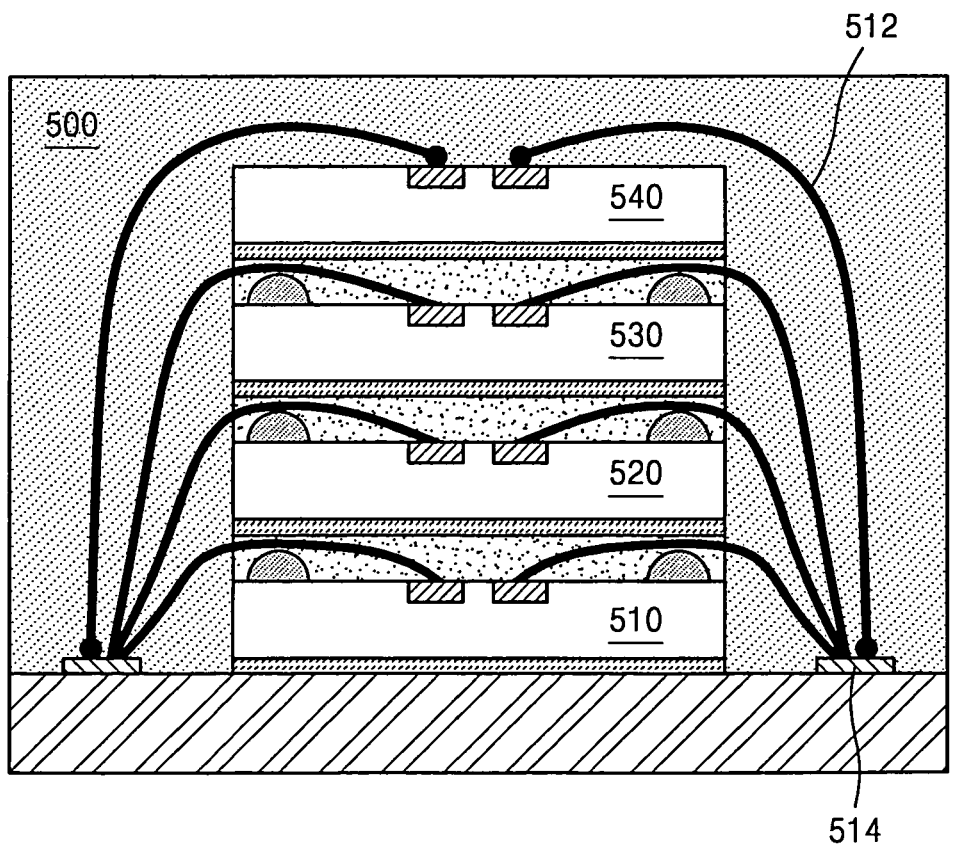
FIG. 17 is a cross-sectional view illustrating a semiconductor multi-chip package according to still another embodiment of the present invention.

FIG. 17 illustrates a still further embodiment implementing principles of the present invention in which a multi-chip package includes more than two stacked chips. Referring to FIG. 17, a multi-chip package 500 according to this embodiment includes three or more stacked chips 510, 520, 530, 540. For simplicity in illustration, all of the bond wires 512 in this figure appear connected to a single bond finger 514. Those skilled in the art will understand, however, that the respective bonding wires 512 are connected to corresponding bond fingers 514 as needed. Each of the stacked chips 510, 520, 530, 540 may have either a center pad configuration or a peripheral pad configuration. Not all of the stacked chips 510, 520, 530, 540 need to have the same pad configuration.

In conclusion, using the insulating structures 260 disclosed as part of the present invention, with or without the interposer 270, multi-chips packages can be formed using lower chips having a center pad configuration. Further, the methods disclosed herein are less expensive than conventional methods and are able to be implemented using existing equipment. Additionally, conventional problems such as wire sweeping or sagging can be avoided.

While the principles of the present invention have been shown and described with reference to the particular embodiments described herein, it will be understood by those skilled in the art that various changes in form and detail may be made thereto without departing from the spirit and scope of the invention, as covered by the following claims.

The invention claimed is:

1. A multi-chip package, comprising:
a package substrate;
a first chip mounted on the package substrate, the first chip having center bonding pads on a substantially center portion thereof;
a plurality of separate, mound-like insulating support structures formed on the first chip, the plurality of insulating support structures located outward of the first bonding pads;
a second chip stacked on the first chip, the second chip electrically connected to the package substrate; and
a bonding wire electrically connected between the package substrate and the center bonding pads, wherein the bonding wire passes through at least one of the separate support structures such that the support structure encloses a portion of the bonding wire on all sides, the at least one of the support structures being monolithic.

2. The multi-chip package of claim 1, further comprising an interposer disposed between the first chip and the second chip.

3. The multi-chip package of claim 2, further comprising an insulating tape formed on a bottom surface of the second chip.

* * * * *